(12) United States Patent
Okamoto

(10) Patent No.: US 6,911,700 B2
(45) Date of Patent: Jun. 28, 2005

(54) SEMICONDUCTOR INTEGRATED CIRCUIT DEVICE INCLUDING DIGITAL AND ANALOG CIRCUITS COMPRISING ELECTROSTATIC DESTRUCTION PROTECTION CIRCUITS

(75) Inventor: Minoru Okamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/664,874

(22) Filed: Sep. 22, 2003

(65) Prior Publication Data

US 2004/0108577 A1 Jun. 10, 2004

(30) Foreign Application Priority Data

Dec. 6, 2002 (JP) ........................................ 2002-355856

(51) Int. Cl.[7] .............................................. H01L 27/06
(52) U.S. Cl. ...................... 257/355; 257/173; 257/356; 257/360; 327/565
(58) Field of Search .......................... 257/173, 355–363; 327/565

(56) References Cited

U.S. PATENT DOCUMENTS 5,453,713 A * 9/1995 Partovi et al. ............... 327/565
5,901,023 A * 5/1999 Tsuji ............................. 361/56

FOREIGN PATENT DOCUMENTS

| JP | 59-193046 | 11/1984 |
| JP | 09-172146 | 6/1997 |
| JP | 10-56138 | 2/1998 |
| JP | 10-085105 | 3/1998 |
| JP | 11-274404 | 10/1999 |

OTHER PUBLICATIONS

Japanese Patent Office; "Notice of Reasons for Rejection" (and translation); c. 2005; pp. 1–4; Japan.

* cited by examiner

Primary Examiner—Minhloan Tran
Assistant Examiner—Thomas L. Dickey
(74) Attorney, Agent, or Firm—McDermott Will & Emery LLP

(57) ABSTRACT

A semiconductor integrated circuit including a digital circuit and an analog circuit which are integrated on a single semiconductor chip comprises a first electrostatic destruction protection circuit, connected to a digital circuit, for protecting the digital circuit from destruction caused by ESD therein by an influence of an input digital signal and a second electrostatic destruction protection circuit, connected to an analog circuit, for protecting the analog circuit from destruction caused by ESD therein by an influence of an input analog signal. A first grounding conductor connected to the first electrostatic destruction protection circuit and a second grounding conductor connected to the second electrostatic destruction protection circuit are connected to each other outside the semiconductor integrated circuit.

5 Claims, 11 Drawing Sheets

SEMICONDUCTOR INTEGRATED CIRCUIT DEVICE INCLUDING DIGITAL AND ANALOG CIRCUITS COMPRISING ELECTROSTATIC DESTRUCTION PROTECTION CIRCUITS

BACKGROUND OF THE INVENTION (a) Field of the Invention

The present invention relates to a semiconductor integrated circuit device improving resistance to destruction caused by electrostatic discharge (ESD) between a digital circuit and an analog circuit in a semiconductor integrated circuit composed of multiple power supplies.

(b) Description of the Related Art

In recent years, semiconductor integrated circuits have been developed to integrate a digital circuit and an analog circuit on a single semiconductor chip as LSI chip technology progresses. In this kind of LSI chip in which the digital circuit and the analog circuit are combined, the influence of noises given by the digital circuit to the analog circuit is reduced by externally supplying plural power sources to each circuit. In order to avoid the destruction caused by ESD of the LSI chip, instead of complete separation between a power supply for the digital circuit and a power supply for the analog circuit and between a ground for the digital circuit and a ground for the analog circuit, the semiconductor integrated circuits are constructed so as to connect the digital circuit to the analog circuit via a circuit (hereinafter, referred to as a "protection circuit") for avoiding destruction caused by ESD.

FIG. 11 is a diagram showing an exemplary structure of a known semiconductor integrated circuit 1000.

The semiconductor integrated circuit 1000 shown in FIG. 11 includes a digital circuit 1010 and an analog circuit 1050. The digital circuit 1010 and the analog circuit 1050 are connected via a control signal line 1080 to each other.

The digital circuit 1010 receives electrical signals from pads 1020a and 1020b through protection circuits 1022a and 1022b. A power supply pad 1024 supplies a digital power source 1034 to the protection circuits 1022a and 1022b. A power supply pad 1025 supplies a digital ground source 1035 to the protection circuits 1022a and 1022b.

Likewise, the analog circuit 1050 receives electrical signals from pads 1060a and 1060b through the protection circuits 1062a and 1062b. A power supply pad 1064 supplies an analog power source 1074 to the protection circuits 1062a and 1062b. A power supply pad 1065 supplies an analog ground source 1075 to the protection circuits 1062a and 1062b.

FIG. 12 is a diagram showing an exemplary structure of the protection circuits 1022a, 1022b, 1062a, and 1062b. For example, as shown in FIG. 12, each circuit is constructed using diodes so as to absorb a surge voltage. Thereby, even when surge voltages are mixed between the power supply pad 1024 for supplying a power source to the digital circuit 1010 and each of the pads 1020a and 1020b for inputting electrical signals, between the power supply pad 1025 and each of pads 1020a and 1020b, between the power supply pad 1064 for likewise supplying a power source to the analog circuit 1050 and each of the pads 1060a and 1060b for inputting electrical signals, and further between the power supply pad 1065 and each of the pads 1060a and 1060b, respectively, charges are bypassed by the circuit shown in FIG. 12, thereby avoiding destruction caused by ESD of the digital circuit 1010 and the analog circuit 1050.

As described above, the protection circuits 1022a and 1022b and the protection circuits 1062a and 1062b function only for the corresponding digital circuit 1010 and analog circuit 1050. In consideration of the case where charges are bypassed by the respective protection circuits 1022a, 1022b, 1062a, and 1062b, leading to the destruction caused by ESD between the digital circuit 1010 and the analog circuit 1050, a protection circuit 1090 is connected between the digital circuit 1010 and the analog circuit 1050. That is, a power source 1034 for the digital circuit 1010 and a power source 1074 for the analog circuit 1050 are connected via the protection circuit 1090 to each other, and ground sources 1035 and 1075 are done likewise.

FIG. 13 is a diagram showing an exemplary structure of the protection circuit 1090. For example, as shown in FIG. 13, the circuit is constructed using diodes so as to prevent the destruction caused by ESD from being caused between the digital circuit 1010 and the analog circuit 1050. The protection circuit 1090 prevents the digital circuit 1010 and the analog circuit 1050 from being directly connected to each other so that it also has the function of absorbing noises from the digital circuit 1010 to the analog circuit 1050.

Many protection circuits other than those having the structures shown in FIGS. 12 and 13 have been devised (for example, see Japanese Unexamined Patent Publications No. 10-56138 and 11-27404).

FIG. 14 is a diagram showing an example of a connection relationship between the pad in the semiconductor integrated circuit 1000 shown in FIG. 11 and a terminal of a package substrate.

For example, the pad 1025 in the semiconductor integrated circuit 1000 is electrically connected via a lead 1327 to a terminal 1326 located on a package substrate 1300 shown in FIG. 14. The connections of the other pads are also performed likewise.

FIG. 15 is a diagram showing an example of connection relationships between the terminals of the package substrate 1300 and external pins. As shown in FIG. 15, the terminal 1326 is electrically connected via an interconnect 1427 to an external pin 1426 inside the package substrate 1300. The connections of the other terminals are also performed likewise.

In this way, the package substrate 1300 and the semiconductor integrated circuit 1000 are connected to each other, and thereafter they are packaged by resin 1410 or the like so as to form an LSI chip 1400.

FIG. 16 is a flow chart showing process steps for fabricating the LSI chip 1400.

As shown in FIG. 16, the semiconductor integrated circuit 1000 is designed in step ST2000, and thereafter the process proceeds to step ST2010 to fabricate the semiconductor integrated circuit 1000. Next, the process proceeds to step ST2020 to integrate the semiconductor integrated circuit 1000 and the package circuit 1300, thereby forming the LSI chip 1400.

Thereafter, the process proceeds to step ST2100 for carrying out an LSI test for the LSI chip 1400. That is, step ST2100 for carrying out the LSI test includes at least step ST2110 for testing whether or not the digital circuit 1010 and the analog circuit 1050 satisfy the specification and step ST2120 for testing these circuits for destruction caused by ESD. After the LSI test in step ST2100, if it is found that the digital circuit 1010 and the analog circuit 1050 satisfy the specification and no destruction caused by ESD occurs, then it follows that the LSI chip 1400 has been completed. On the other hand, if it is found that the digital circuit 1010 or the analog circuit 1050 does not satisfy the specification or that the destruction caused by ESD occurs in the digital circuit 1010 or the analog circuit 1050, the process returns to the step ST2000 and repeats the subsequent steps.

However, as described above, the protection circuit 1090 is inserted for the purpose of reducing the influence of noises produced in the digital circuit 1010 and improving resistance to the ESD. However, when the period during which surge charges pass through the protection circuit 1090 is long, surge voltages may not be appropriately discharged. At this time, a high voltage may be applied, via a control signal that flows into a control signal line 1080 connecting the digital circuit 1010 to the analog circuit 1050, to these circuits, and thus a portion of the digital circuit 1010 or the analog circuit 1050 connecting the control signal line 1080 therebetween may be destroyed.

Such a case can be handled by changing the protection circuit 1090 in its design so as to reduce the period during which the surge charges pass through the protection circuit 1090. More particularly, it can be handled by again carrying out step ST2000 shown in FIG. 16. However, the semiconductor integrated circuit 1000 need again be fabricated as shown in step ST2010 shown in FIG. 16. The semiconductor integrated circuit 1000 is fabricated through multiple fabrication process steps. Therefore, a long period exceeding at least one month becomes necessary for again fabricating the semiconductor integrated circuit 1000. In addition, a mask required for fabrication costs very expensive. Besides, finally, the resistance to surge voltages applied to the LSI chip 1400 and the influence of noises need totally be judged. It is difficult to change the design of the protection circuit 1090 in view of all the conditions at the change of the design. Therefore, at the change of the design, it cannot surely be judged that the resistance to the ESD is improved and the influence of noises is also small.

This kind of destruction caused by ESD occurs with a high frequency in the process of carrying the LSI chip or the process of mounting the LSI chip to the substrate.

SUMMARY OF THE INVENTION

A first object of the present invention is to provide a semiconductor integrated circuit capable of improving resistance to ESD at a low cost in a short period. A second object of the present invention is to provide a method for fabricating a semiconductor integrated circuit device capable of improving resistance to ESD at a low cost in a short period.

In order to solve the problem, a first semiconductor integrated circuit device of the present invention including a digital circuit and an analog circuit which are integrated on a single semiconductor chip, comprises: a first electrostatic destruction protection circuit, connected to the digital circuit, for protecting the digital circuit from destruction caused by ESD in the digital circuit by an influence of an input digital signal; and a second electrostatic destruction protection circuit, connected to the analog circuit, for protecting the analog circuit from destruction caused by ESD in the analog circuit by an influence of an input analog signal, wherein a first grounding conductor connected to the first electrostatic destruction protection circuit and a second grounding conductor connected to the second electrostatic destruction protection circuit are connected to each other outside the semiconductor integrated circuit device.

According to the first semiconductor integrated circuit device, the first grounding conductor connected to the first electrostatic destruction protection circuit and the second grounding conductor connected to the second electrostatic destruction protection circuit are connected to each other outside the semiconductor integrated circuit device. Therefore, a semiconductor integrated circuit device capable of improving resistance to ESD can be provided at a low cost in a short period.

In the first semiconductor integrated circuit device of the present invention, the first grounding conductor and the second grounding conductor are preferably connected to each other inside a package substrate of the semiconductor integrated circuit device.

Thus, a semiconductor integrated circuit device capable of improving resistance to ESD can be provided at a low cost in a short period.

In the first semiconductor integrated circuit device of the present invention, the first grounding conductor and the second grounding conductor are preferably connected to each other outside a package substrate of the semiconductor integrated circuit device.

Thus, whether or not the first grounding conductor and the second grounding conductor are to be connected to each other can be easily selected, and a trade-off between the enhancement of resistance to destruction caused by ESD and reduction of noises can be made.

In the first semiconductor integrated circuit device of the present invention, it is preferable that the first grounding conductor and the second grounding conductor are connected to each other using a capacitance outside a package substrate of the semiconductor integrated circuit device.

Thus, the capacitance can be arbitrarily set. Therefore, a trade-off between the enhancement of resistance to destruction caused by ESD and reduction of noises can be made in more detail.

In the first semiconductor integrated circuit device of the present invention, the first grounding conductor and the second grounding conductor are preferably connected to each other via a member for electrically connecting the semiconductor integrated circuit device to a package substrate of the semiconductor integrated circuit device.

Thus, resistance to destruction caused by ESD can be enhanced without changing the package substrate itself.

A first method for fabricating a semiconductor integrated circuit device including a digital circuit and an analog circuit are integrated on a single semiconductor chip, comprises: a circuit test step of judging whether or not the digital circuit connected to a first electrostatic destruction protection circuit for protecting the digital circuit from destruction caused by ESD in the digital circuit by an influence of an input digital signal and the analog circuit connected to a second electrostatic destruction protection circuit for protecting the analog circuit from destruction caused by ESD in the analog circuit by an influence of an input analog signal satisfy the specification; an electrostatic destruction test step of, when it is judged in the circuit test step that both the digital circuit and the analog circuit satisfy the specification, judging whether or not destruction caused by ESD occurs for the digital circuit and the analog circuit; and an external connection step of, when it is judged in the electrostatic destruction test step that destruction caused by ESD occurs in at least one of the digital circuit and the analog circuit, connecting a first grounding conductor connected to the first electrostatic destruction protection circuit to a second grounding conductor connected to the second electrostatic destruction protection circuit outside the semiconductor integrated circuit device.

According to the first method for fabricating a semiconductor integrated circuit device of the present invention, the first grounding conductor and the second grounding conductor are connected to each other outside the semiconductor integrated circuit device in accordance with results of the first and second LSI test steps. Therefore, a method for fabricating a semiconductor integrated circuit device capable of improving resistance to ESD can be provided at a low cost in a short period.

In the first method for fabricating a semiconductor integrated circuit device of the present invention, the external connection step is preferably the step of connecting the first grounding conductor to the second grounding conductor inside a package substrate of the semiconductor integrated circuit device.

Thus, a method for fabricating a semiconductor integrated circuit device capable of improving resistance to ESD can be provided at a low cost in a short period.

In the first method for fabricating a semiconductor integrated circuit device of the present invention, the external connection step is preferably the step of connecting the first grounding conductor to the second grounding conductor outside a package substrate of the semiconductor integrated circuit device.

Thus, whether or not the first grounding conductor and the second grounding conductor are to be connected to each other can be easily selected, and a trade-off between the enhancement of resistance to destruction caused by ESD and reduction of noises can be made.

In the first method for fabricating a semiconductor integrated circuit device of the present invention, the external connection step is preferably the step of connecting the first grounding conductor to the second grounding conductor using a capacitance outside a package substrate of the semiconductor integrated circuit device.

Thus, the capacitance can be arbitrarily set. Therefore, a trade-off between the enhancement of resistance to destruction caused by ESD and reduction of noises can be made in more detail.

In the first method for fabricating a semiconductor integrated circuit device of the present invention, the external connection step is preferably the step of connecting the first grounding conductor to the second grounding conductor via a member for electrically connecting the semiconductor integrated circuit device to a package substrate of the semiconductor integrated circuit device.

Thus, resistance to destruction caused by ESD can be enhanced without changing the package substrate itself.

A second method for fabricating a semiconductor integrated circuit device comprises: a first package production step of producing a first package substrate in which a first grounding conductor connected to a first electrostatic destruction protection circuit for protecting a first digital circuit from destruction caused by ESD in the first digital circuit by an influence of an input digital signal and a second grounding conductor connected to a second electrostatic destruction protection circuit for protecting a first analog circuit from destruction caused by ESD in the first analog circuit by an influence of an input analog signal are not connected to each other inside a package substrate of a first semiconductor integrated circuit device including the first digital circuit and the first analog circuit which are integrated on a single semiconductor chip; a second package production step of producing a second package substrate in which a third grounding conductor connected to a third electrostatic destruction protection circuit for protecting a second digital circuit from destruction caused by ESD in the second digital circuit by an influence of an input digital signal and a fourth grounding conductor connected to a fourth electrostatic destruction protection circuit for protecting a second analog circuit from destruction caused by ESD in the second analog circuit by an influence of an input analog signal are connected to each other inside a package substrate of a second semiconductor integrated circuit device including the second digital circuit and the second analog circuit which are integrated on a single semiconductor chip; a first LSI test step to be performed after the first package production step, including a first circuit test step of judging whether or not the first digital circuit and the first analog circuit satisfy the specification and a first electrostatic destruction test step of, when it is judged in the first circuit test step that both the first digital circuit and the first analog circuit satisfy the specification, judging whether or not destruction caused by ESD occurs for the first digital circuit and the first analog circuit; a second LSI test step to be performed after the second package production step, including a second circuit test step of judging whether or not the second digital circuit and the second analog circuit satisfy the specification and a second electrostatic destruction test step of, when it is judged in the second circuit test step that both the second digital circuit and the second analog circuit satisfy the specification, judging whether or not destruction caused by ESD occurs for the second digital circuit and the second analog circuit; a first package selection step of, when it is judged in the first electrostatic destruction test step of the first LSI test step that no destruction caused by ESD occurs in both the first digital circuit and the first analog circuit, selecting the first package substrate; and a second package selection step of, when it is judged in the first electrostatic destruction test step of the first LSI test step that destruction caused by ESD occurs in at least one of the first digital circuit and the first analog circuit and it is judged in the second electrostatic destruction test step of the second LSI test step that no destruction caused by ESD occurs in both the second digital circuit and the second analog circuit, selecting the second package substrate.

According to the second method for fabricating a semiconductor integrated circuit device of the present invention, a period required for LSI test can be reduced, and a method for fabricating a semiconductor integrated circuit device capable of improving resistance to ESD can be provided.

DESCRIPTION OF THE PREFERRED EMBODIMENT

An embodiment of the present invention will be described hereinafter with reference to the drawings.

Figure 1:
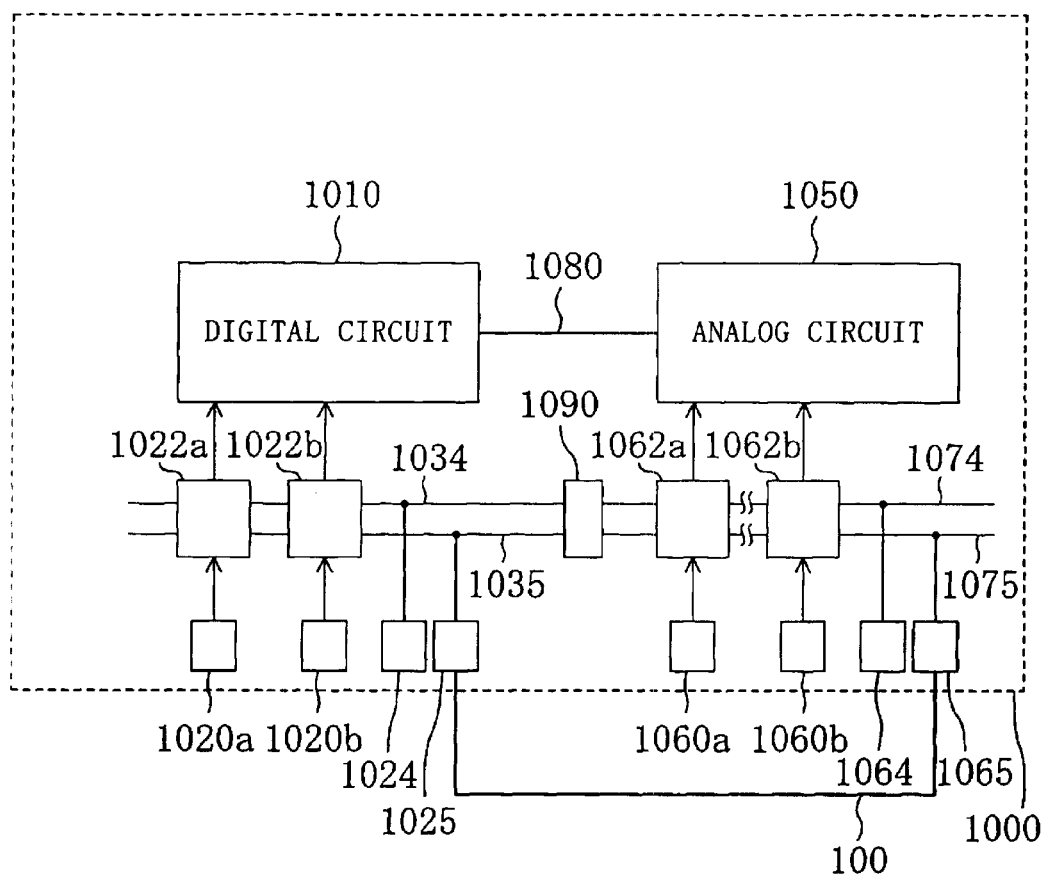
FIG. 1 is a diagram for explaining a semiconductor integrated circuit according to an embodiment of the present invention.

FIG. 1 is a diagram for explaining a semiconductor integrated circuit 1000 according to an embodiment of the present invention.

The semiconductor integrated circuit 1000 shown in FIG. 1 includes a digital circuit 1010 and an analog circuit 1050. The digital circuit 1010 and the analog circuit 1050 are connected via a control signal line 1080 to each other.

The digital circuit 1010 receives electrical signals from pads 1020a and 1020b through protection circuits 1022a and 1022b (both corresponding to a first electrostatic destruction protection circuit). A power supply pad 1024 supplies a digital power source 1034 to the protection circuits 1022a and 1022b. A power supply pad 1025 supplies a digital ground source 1035 to the protection circuits 1022a and 1022b.

Likewise, the analog circuit 1050 receives electrical signals from pads 1060a and 1060b through protection circuits 1062a and 1062b (both corresponding to a second electrostatic destruction protection circuit). A power supply pad 1064 supplies an analog power source 1074 to the protection circuits 1062a and 1062b. A power supply pad 1065 supplies an analog ground source 1075 to the protection circuits 1062a and 1062b.

Figure 11:
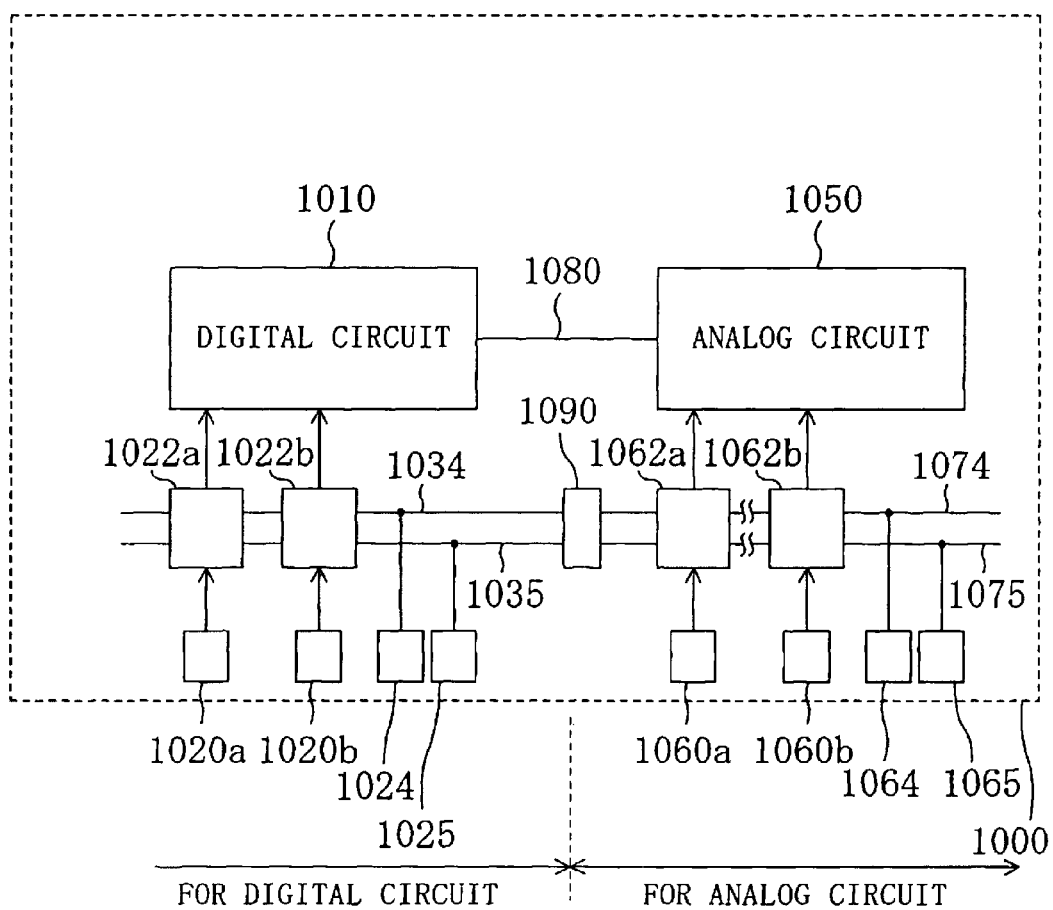
FIG. 11 is a diagram showing an exemplary structure of a known semiconductor integrated circuit.
Figure 12:
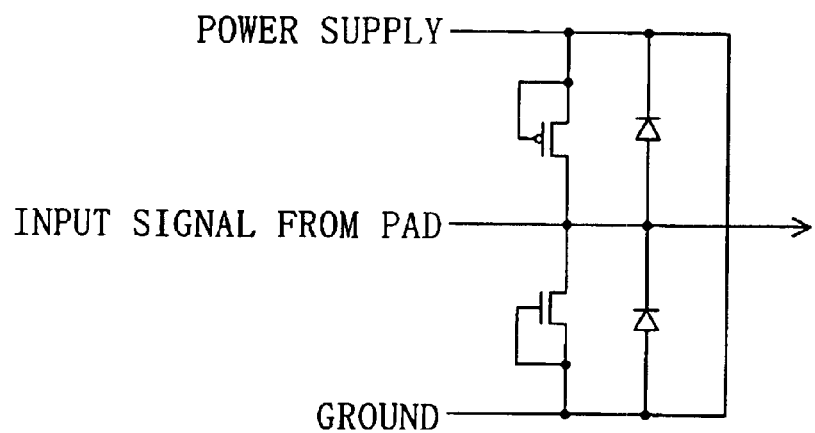
FIG. 12 is a diagram showing an example of a protection circuit.
Figure 13:
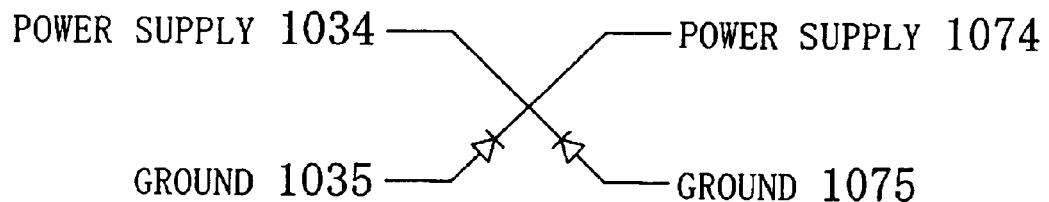
FIG. 13 is a diagram showing an example of another protection circuit.

The semiconductor integrated circuit 1000 shown in FIG. 1 is distinct from the known semiconductor integrated circuit 1000 shown in FIG. 11 in that an interconnect (corresponding to a first grounding conductor) to which the digital ground source 1035 is supplied and an interconnect (corresponding to a second grounding conductor) to which the analog ground source 1075 is supplied are electrically connected via the power supply pad 1025 and the power supply pad 1065 to each other by using a conductor 100 outside the semiconductor integrated circuit 1000. Thereby, a period during which surge charges pass through the protection circuit 1090 can be reduced, and static electricity can be appropriately discharged.

In this case, since the interconnect to which the digital ground source 1035 is supplied and the interconnect to which the analog ground source 1075 is supplied are connected to each other, it is feared that noises produced in the digital circuit 1010 enter the analog circuit. However, an interconnect capacitance outside the semiconductor integrated circuit 1000 is approximately 1000 times as large as that inside the semiconductor integrated circuit 1000. Therefore, the noises produced in the digital circuit 1010 hardly affect the analog circuit 1050.

Hereinafter, a description will be given of examples in which an interconnect to which a digital ground source 1035 is supplied and an interconnect to which an analog ground source 1075 is supplied are connected to each other outside the semiconductor integrated circuit 1000.

EXAMPLE OF CONNECTION (1)

Figure 2:
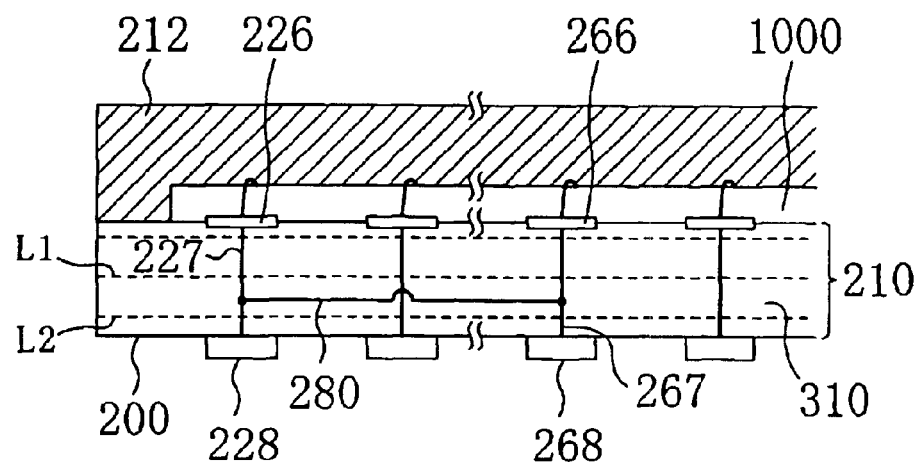
FIG. 2 is a view showing an LSI chip for explaining an example in which connection is performed inside a package substrate.

FIG. 2 is a view showing an LSI chip 200 for explaining an example in which the connection is performed inside a package substrate 210.

The LSI chip 200 shown in FIG. 2 comprises the semiconductor integrated circuit 1000, the package substrate 210 and an encapsulating compound 212. A terminal 226 and a terminal 266 are ones constructed on the package substrate 210. The terminal 226 is connected to a power supply pad 1025 in the semiconductor integrated circuit 1000, that is, the interconnect to which a digital ground source 1035 is supplied. The terminal 266 is connected to a power supply pad 1065 in the semiconductor integrated circuit 1000, that is, the interconnect to which an analog ground source 1075 is supplied. The terminals 226 and 266 are connected via interconnects 227 and 267 to external pins 228 and 268 of the LSI chip 200, respectively.

The power supply pad 1025 for supplying the digital ground source 1035 and the power supply pad 1065 for supplying the analog ground source 1075 are connected to each other by connecting the interconnects 227 and 267 via an interconnect 280 to each other inside the package substrate 210.

A description will be given of the case where the package substrate 210 is composed of multiple layers.

Figure 3:
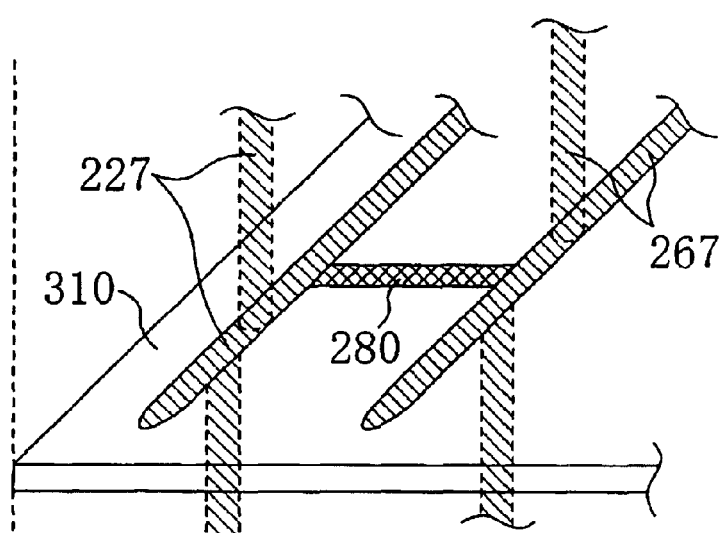
FIG. 3 is a view schematically showing a certain one of plural layers in the package substrate.

FIG. 3 is a view schematically showing a certain one of plural substrate layers in the package substrate 210. More particularly, FIG. 3 is a view taken along the cross sections L1 and L2 shown in FIG. 2. As shown in FIG. 3, the interconnects 227 and 267 are connected via the interconnect 280 to each other in the layer 310 in which these interconnects 227 and 267 are formed. In order to facilitate the understanding, FIG. 3 is simplified by showing interconnect layers and the like rectilinearly. However, it is needless to say that the connection is specifically performed in a convenient position for an interconnect pattern in view of various elements.

EXAMPLE OF CONNECTION (2)

Figure 4:
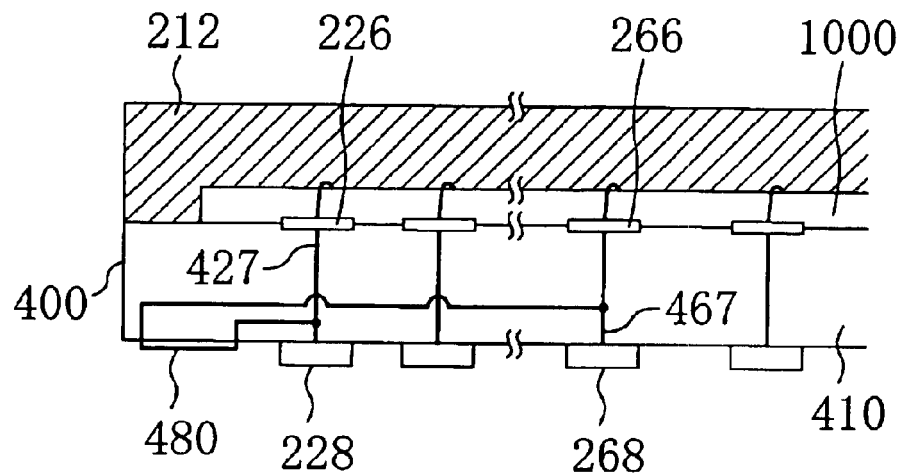
FIG. 4 is a view showing the LSI chip for explaining an example in which connection is performed outside the package substrate.

FIG. 4 is a view showing an LSI chip 400 for explaining an example in which the connection is performed outside the package substrate 410.

The LSI chip 400 shown in FIG. 4 comprises the semiconductor integrated circuit 1000, the package substrate 410, and an encapsulating compound 212. From an interconnect 427 connected to the interconnect of the semiconductor integrated circuit 1000 to which the digital ground source 1035 is supplied and an interconnect 467 connected to the interconnect thereof to which the analog ground source 1075 is supplied, their outputs are led out of the package substrate 410 and are connected via an interconnect 480 to each other on the back surface of the LSI chip 400.

Figure 5:
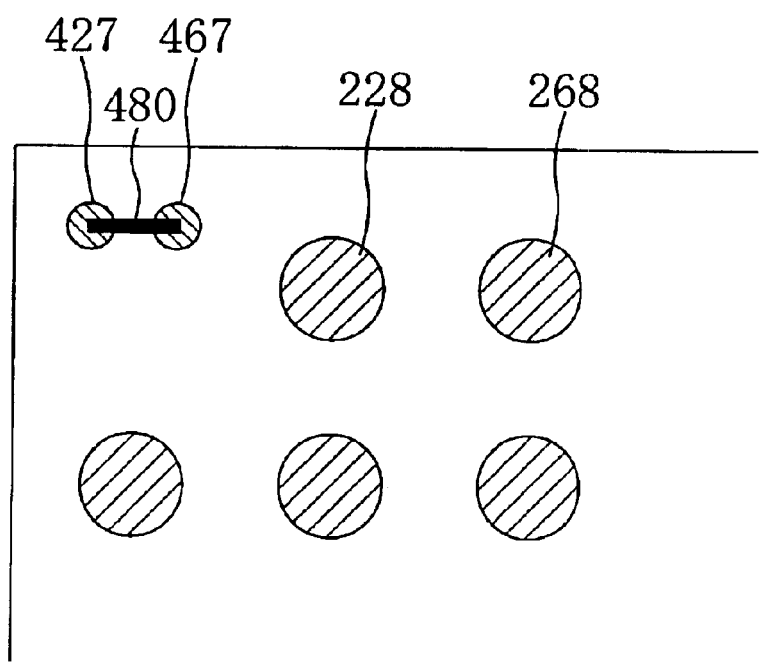
FIG. 5 is a view showing the back surface of the LSI chip.

FIG. 5 is a view showing the back surface of the LSI chip 400. More specifically, a connection part of the interconnect 427 and a connection part of the interconnect 467 are electrically connected via the interconnect 480 to each other.

Thereby, whether or not the connection using the interconnect 480 is to be performed can be selected outside. Therefore, after completion of the LSI chip 400, a trade-off between the enhancement of resistance to pressure caused by ESD and reduction of noises can be made.

EXAMPLE OF CONNECTION (3)

Figure 6:
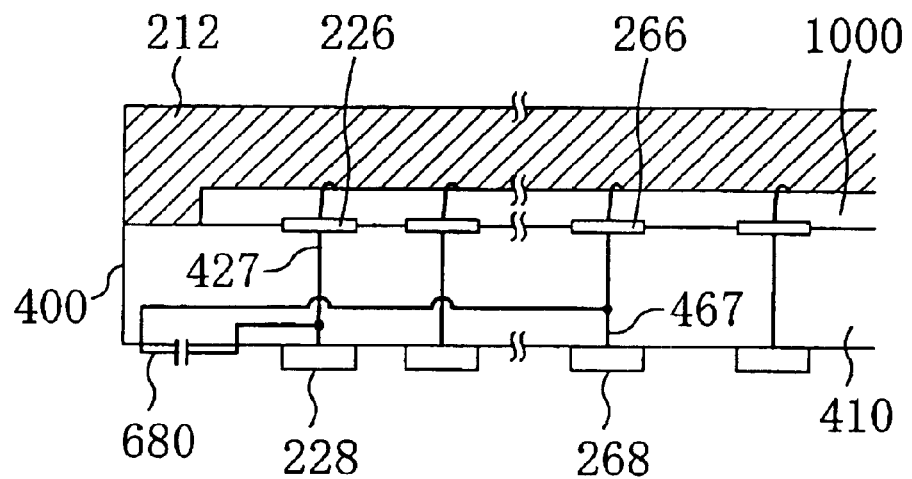
FIG. 6 is a view showing the LSI chip for explaining an example in which connection is performed using a capacitance outside the package substrate.

FIG. 6 is a view showing the LSI chip 400 for explaining an example in which the connection is performed using a capacitance outside the package substrate 410.

According to the LSI chip 400 shown in FIG. 6, from the interconnect 427 connected to the interconnect to which the ground source 1035 is supplied and the interconnect 467 connected to the interconnect to which the ground source 1075 is supplied, their outputs are led out of the package substrate 410 and are connected to each other on the back surface of the LSI chip 400, as in the case of the LSI chip 400 shown in FIG. 4. However, the one shown in FIG. 6 is distinct from the one shown in FIG. 4 in that the interconnects 427 and 467 are connected to each other by using not the interconnect 480 but a condenser 680.

Figure 7:
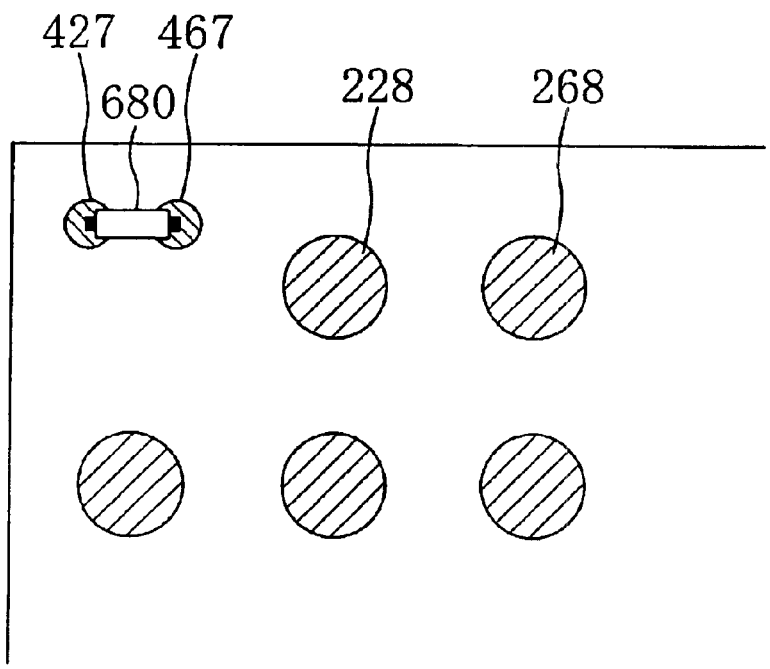
FIG. 7 is a view showing the back surface of the package substrate.

FIG. 7 is a view showing the back surface of the package substrate 400. More particularly, a connection part of the interconnect 427 and a connection part of the interconnect 467 are connected to each other by using the condenser 680.

Thereby, the capacitance of the condenser can be arbitrarily selected outside at the connection using the condenser 680. Therefore, after completion of the LSI chip 400, a trade-off between the enhancement of resistance to pressure caused by ESD and reduction of noises can be adjusted more finely.

EXAMPLE OF CONNECTION (4)

Figure 8:
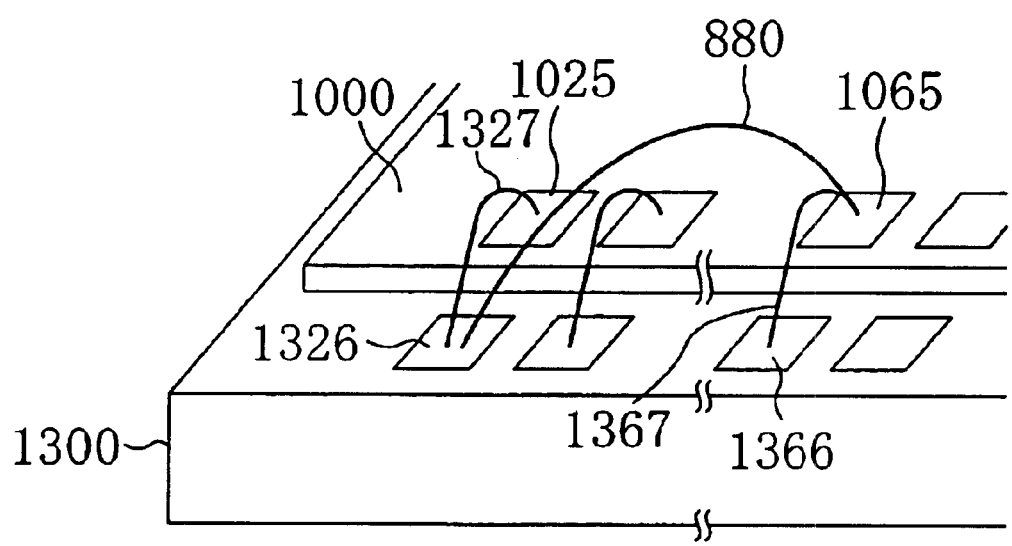
FIG. 8 is a diagram showing the LSI chip for explaining an example in which connection is performed using a lead outside.

FIG. 8 is a view showing the LSI chip 400 for explaining an example in which the connection is performed outside by using a lead.

The power supply pad 1025 connected to the interconnect of the semiconductor integrated circuit 1000 to which the digital ground source 1035 is supplied and the power supply pad 1065 connected to the interconnect thereof to which the analog ground source 1075 is supplied are connected to each other by connecting a terminal 1326 located on a package substrate 1300 and the power supply pad 1065 via a lead 880 to each other. Although in this embodiment a description is given of the case where the terminal 1326 and the power supply pad 1065 are connected via the lead to each other, it is needless to say that a terminal 1366 and the power supply pad 1025 may also be connected via the lead to each other. It is desirable in each case that the distance at which they are connected via a lead be short.

Thereby, resistance to pressure caused by ESD can be enhanced without changing the package substrate as shown in FIGS. 2 and 3.

Hereinafter, methods for fabricating the semiconductor integrated circuit device will be described as modified examples of this embodiment.

<Method for Fabricating Semiconductor Integrated Circuit Device (1)>

Figure 9:
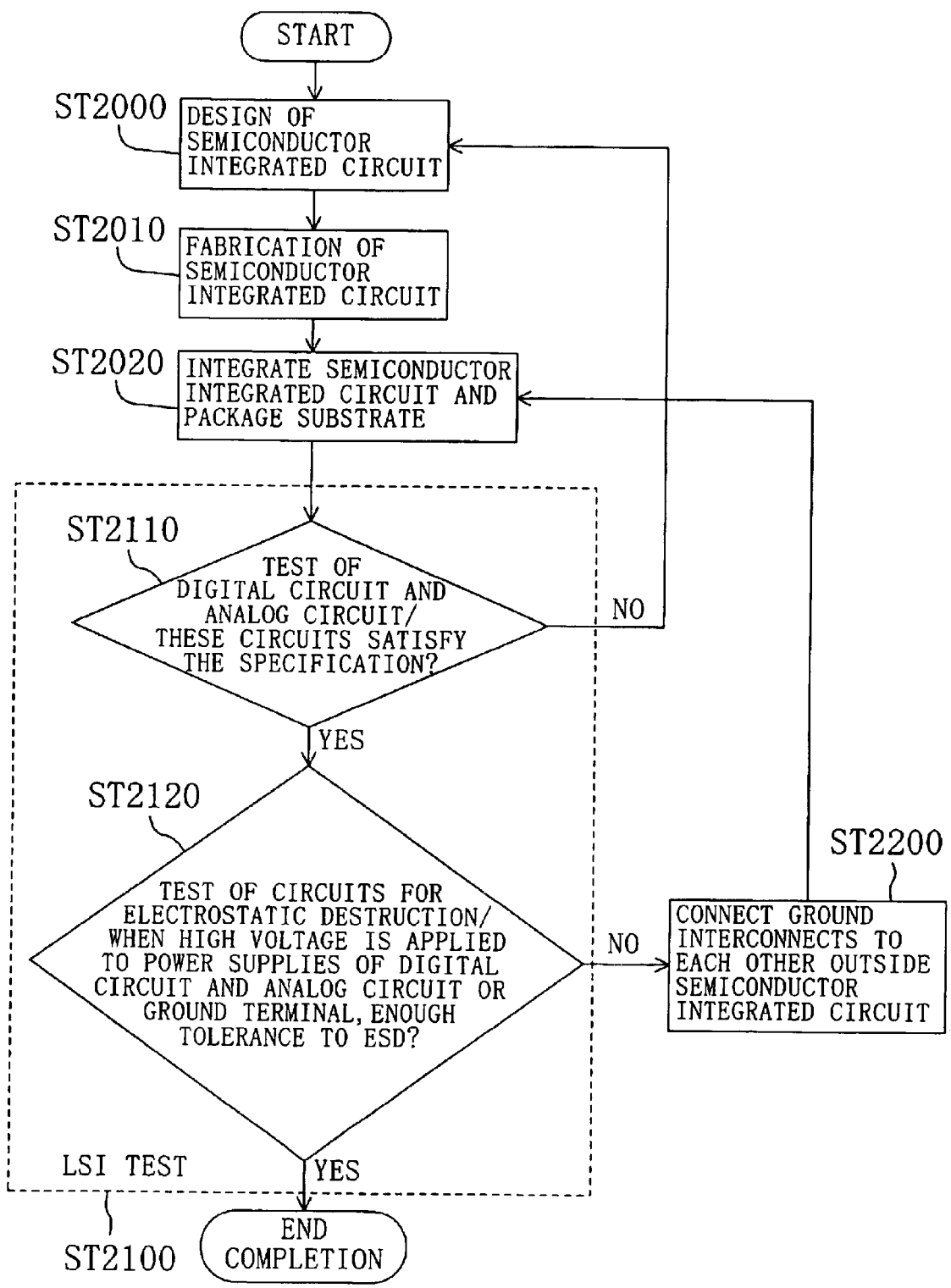
FIG. 9 is a flow chart for explaining a method for fabricating a semiconductor integrated circuit device according to a modified example of this embodiment.

FIG. 9 is a flow chart for explaining a method for fabricating a semiconductor integrated circuit device according to a modified example of this embodiment of the present invention.

Figure 14:
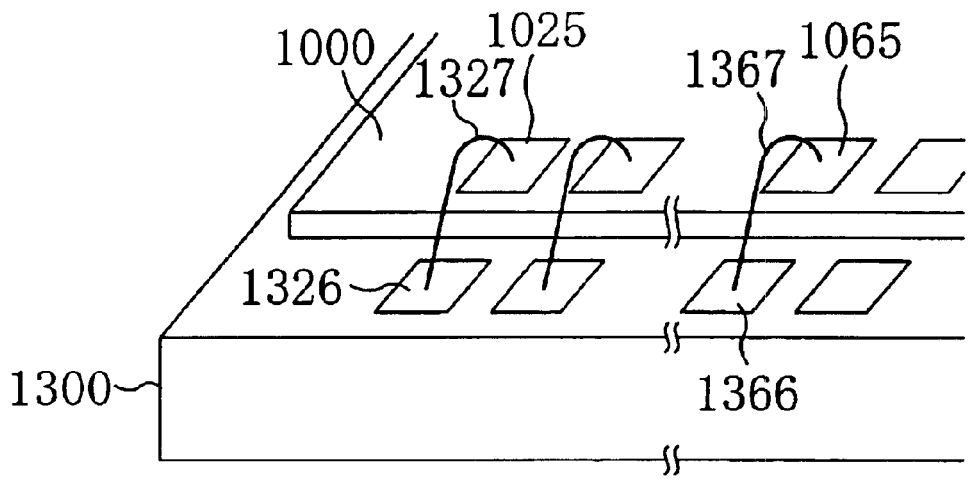
FIG. 14 is a view for explaining connection relationships between pads in the semiconductor integrated circuit and terminals of the package substrate.

First, a semiconductor integrated circuit 1000 is designed in step ST2000, and thereafter the process proceeds to step ST2010 to fabricate the semiconductor integrated circuit 1000. Next, in step ST2020, the semiconductor integrated circuit 1000 and a package substrate 1300 are integrated, for example, to form an LSI chip 1400 shown in FIG. 14. The process proceeds to step ST2100 for carrying out an LSI test.

Step ST2100 for carrying out the LSI test includes at least step ST2110 (corresponding to a circuit test step) for testing operations of the digital circuit 1010 and the analog circuit 1050 and step ST2120 (corresponding to an electrostatic destruction test step) for testing these circuits for destruction caused by ESD.

In step ST2110 for testing the operations of the digital circuit 1010 and the analog circuit 1050, whether or not the operations are performed as specified is judged. When the operations are performed as specified (if YES in step ST2110), the process proceeds to step ST2120. When the operations are not performed as specified (if NO in step ST2110), the process returns to step ST2000 so as to again begin with a design of a semiconductor integrated circuit.

Next, step ST2120 for testing the circuits for destruction caused by ESD is carried out, for example, in the following manner.

Figure 15:
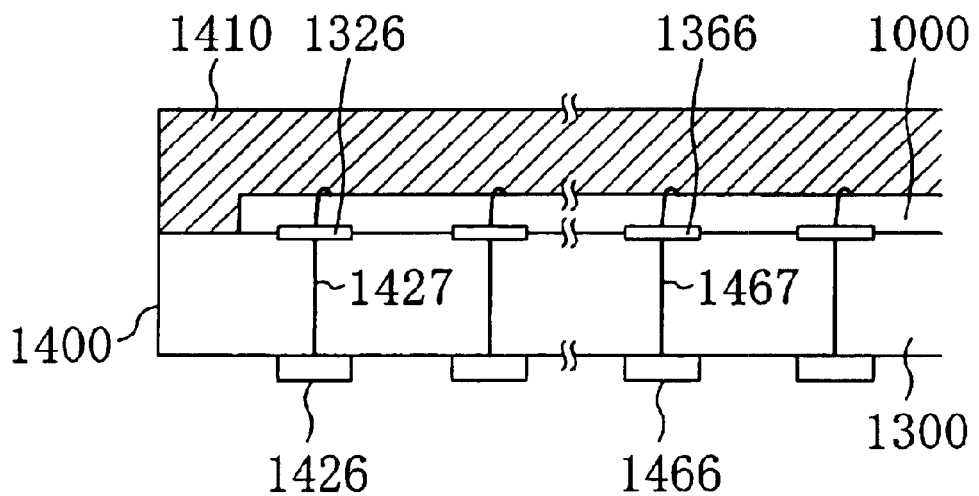
FIG. 15 is a view for explaining connection relationships between the terminals of the package substrate and external pins.
Figure 16:
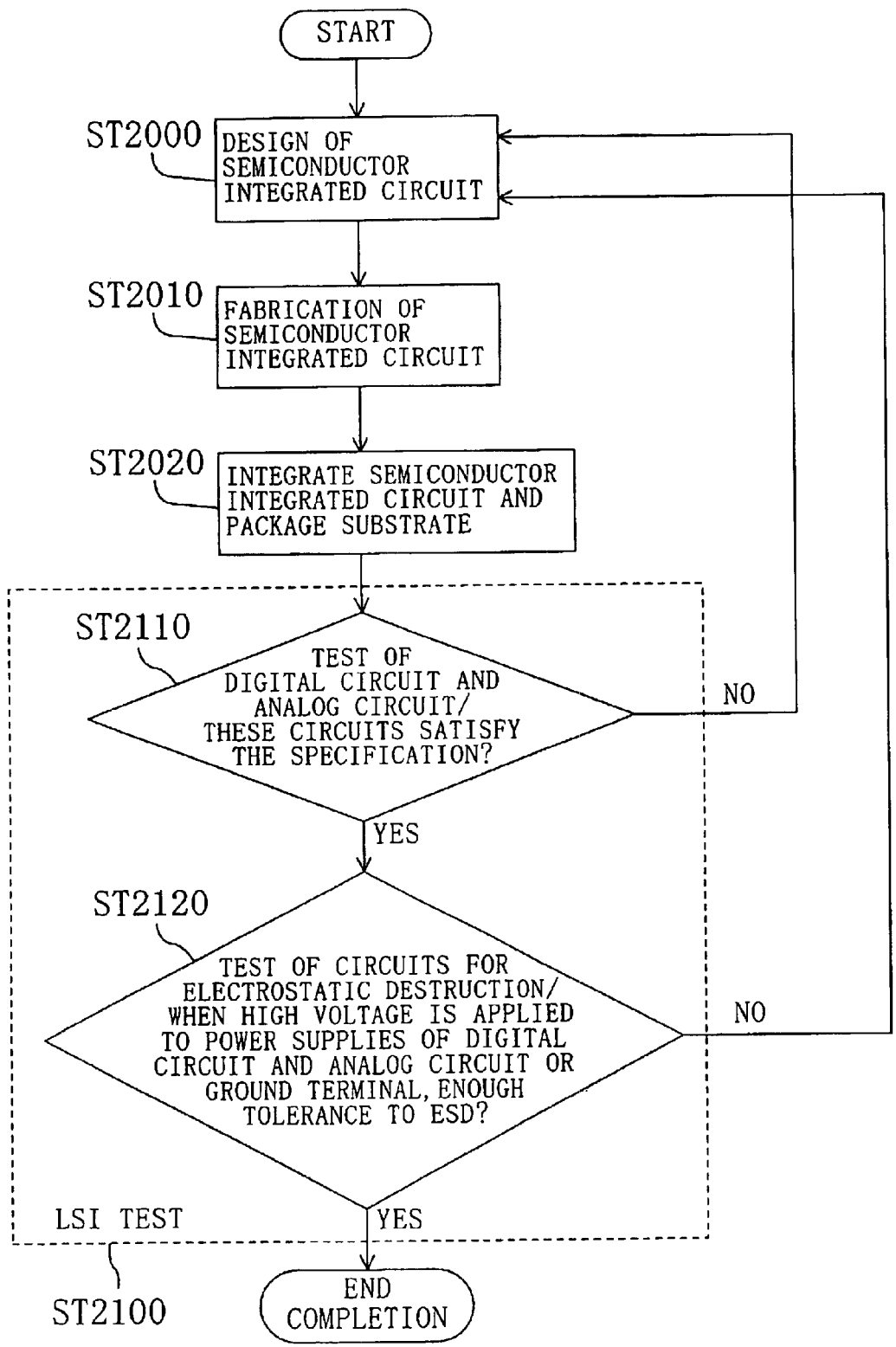
FIG. 16 is a flow chart for explaining a known method for fabricating an LSI chip.

First, for example, external pins 1426 and 1466 shown in FIG. 15 are fixed to a grounding level (potential 0), and a high voltage is applied sequentially to the other external pins. When the operation of the voltage-applied LSI chip 1400 is checked and consequently a normal operation is performed, it is judged that no destruction caused by ESD takes place (YES in step ST2120). On the other hand, when a normal operation is not performed, that is, when destruction caused by ESD takes place (if NO in step ST2120), the process proceeds to step ST2200.

In step ST2200, the power supply pad 1025 for supplying the digital ground source 1035 and the power supply pad 1065 for supplying the analog ground source 1075 are electrically connected to each other outside the semiconductor integrated circuit 1000 (corresponding to an external connection step). This connecting manner is as described above.

Thereafter, the process returns to step ST2020, wherein the semiconductor integrated circuit 1000 having the process of the step ST2200 completed and the package substrate are integrated. Subsequently, the LSI test of step ST2100 is carried out. Then, if it becomes possible to judge that the digital circuit 1010 and the analog circuit 1050 satisfy the specification and no destruction caused by ESD takes place, this means that the semiconductor integrated circuit device is completed.

As obvious from the above description, even when destruction caused by ESD takes place in step ST2120, steps for the design and fabrication of the semiconductor integrated circuit 1000 (steps ST2000 and ST2010) can be omitted. Therefore, the LSI chip 1400 can be completed in a short period.

<Method for Fabricating Semiconductor Integrated Circuit Device (2)>

Next, another method for fabricating a semiconductor integrated circuit device will be described.

Figure 10:
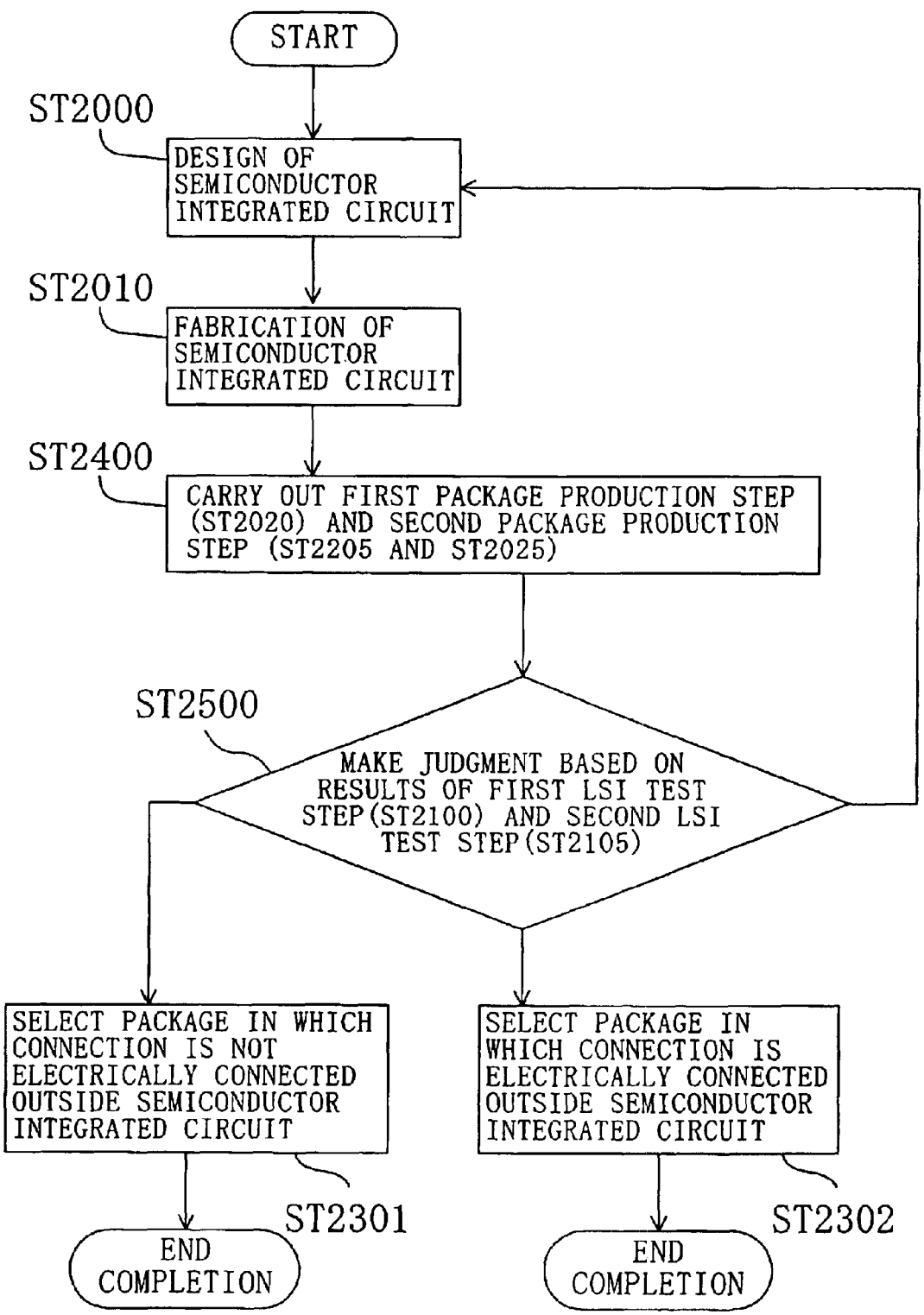
FIG. 10 is a flow chart for explaining another method for fabricating a semiconductor integrated circuit device.

FIG. 10 is a flow chart for explaining another method for fabricating a semiconductor integrated circuit device.

In the fabricating method shown in FIG. 10, first, operations in steps ST2000 and ST2010 are performed as in FIG. 9. In this fabricating method, the process proceeds to step ST2400.

Step ST2400 includes a first package production step (step ST2020) and a second package production step (steps ST2205 and ST2025).

The first package production step (step ST2020) is one for integrating the semiconductor integrated circuit 1000 in which an interconnect to which the ground source 1035 is supplied (here, corresponding to a first grounding conductor) and an interconnect to which a ground source 1075 is supplied (here, corresponding to a second grounding conductor) are not connected to each other and the package substrate.

In the second package production step (steps ST2205 and ST2025), first, an interconnect to which the digital ground source 1035 is supplied (here, corresponding to a third grounding conductor) and an interconnect to which the analog ground source 1075 is supplied (here, corresponding to a fourth grounding conductor) are electrically connected via the power supply pads 1025 and 1065 for supplying the ground sources 1035 and 1075, respectively, to each other outside the semiconductor integrated circuit (step ST2205). Then, the process proceeds to a step (step ST2205) for integrating the semiconductor integrated circuit 1000 in which these interconnects are electrically connected to each other outside as described above and the package substrate. This connecting manner is as described above.

To be specific, in step ST2020 of step ST2400, the semiconductor integrated circuit 1000 in which the interconnect to which the ground source 1035 is supplied and the interconnect to which the ground source 1075 is supplied are not electrically connected to each other outside and the package substrate are integrated. In addition, in step ST2025 of step ST2400, the semiconductor integrated circuit 1000 in which the interconnect to which the ground source 1035 is supplied and the interconnect to which the ground source 1075 is supplied are electrically connected to each other outside and the package substrate are integrated. Thereafter, the process proceeds to step ST2500.

In step ST2500, a first LSI test step (step ST2100) and a second LSI test step (step ST2105) are carried out, so that the subsequent step is determined. In steps ST2100 and ST2105, the LSI test is carried out as described above.

More specifically, first, when the first LSI test in step ST2100 of step ST2500 judges that the LSI is "normal" (that is, when the test of the digital circuit 1010 (here corresponding to a first digital circuit) and the analog circuit 1050 (here corresponding to a first analog circuit), the test here corresponding to a first circuit test step, and the test of the circuits for destruction caused by ESD, here corresponding to a first electrostatic destruction test step, both judge that they are "normal"), the process proceeds to step ST2301 regardless of the result of the second LSI test in step ST2105. In step ST2301, a package substrate on which the power supply pad 1025 for supplying the digital ground source 1035 and the power supply pad 1065 for supplying the analog ground source 1075 are not electrically connected to each other outside the semiconductor integrated circuit 1000 is selected (corresponding to a first package selection step).

When the first LSI test in step ST2100 judges that the LSI is "not normal" (that is, the test of the digital circuit 1010 and the analog circuit 1050 judges that they are "normal" and the test of the circuits for the destruction caused by ESD judges that they are "not normal") but the second LSI test in step ST2105 judges that the LSI is "normal" (that is, the test of the digital circuit 1010 (here corresponding to a second digital circuit) and the analog circuit 1050 (here corresponding to a second analog circuit), the test here corresponding to a second circuit test step, and the test of the circuits for the destruction caused by ESD, here corresponding to a second electrostatic destruction test step, both judge that they are "normal"), the process proceeds to step ST2302. In step ST2302, a package substrate on which the power supply pad 1025 for supplying the digital ground source 1035 and the power supply pad 1065 for supplying the analog ground source 1075 are electrically connected to each other outside the semiconductor integrated circuit 1000 is selected (corresponding to a second package selection step).

When the results of the first and second LSI tests in steps ST2100 and ST2105 of step ST2500 are other than the above results (that is, when the circuits are judged as "not normal" in the first or second circuit test step and when the circuits are judged as "normal" in the first circuit test step but judged as "not normal" in the first electrostatic destruction test step and then the circuits are judged as "normal" in the second circuit test step but judged as "not normal" in the second electrostatic destruction test step), the process returns to step ST2000 to again begin with the design of the semiconductor integrated circuit 1000.

As described above, according to the method for fabricating a semiconductor integrated circuit device shown in FIG. 10, a period required for a further LSI test (step ST2100) to be performed after step ST2200 shown in FIG. 9 can be reduced as compared with the fabricating method shown in FIG. 9.

Although in the above examples the cases where the interconnect to which the digital ground source 1035 is supplied and the interconnect to which the analog ground source 1075 is supplied are connected to each other inside or outside the package substrate, or by further using the lead are described with reference to FIGS. 2 to 8, it is needless to say that the shapes of the connection parts, the terminals and the pads are not restricted to those shown in the drawings. Physical positions of pads or the like are not restricted to those in this embodiment.

Although the case where the external terminal of the LSI chip is located on the back surface of the package substrate is described, the case where it is located on the side thereof is likewise applicable to this invention. Although the case where the connection is performed on the back surface thereof by using the interconnect or the condenser is described with reference to FIGS. 3 and 5, the case where the connection is performed on the side thereof is likewise applicable to this invention. In the case of FIG. 3 or 5, it is not impossible that the connection is likewise performed on the front surface thereof.

What is claimed is:

1. A semiconductor integrated circuit device including a digital circuit and an analog circuit which are integrated on a single semiconductor chip, said device comprising:

a first electrostatic destruction protection circuit, connected to the digital circuit, for protecting the digital circuit from destruction caused by electrostatic discharge in the digital circuit by an influence of an input digital signal;

a second electrostatic destruction protection circuit, connected to the analog circuit, for protecting the analog circuit from destruction caused by electrostatic discharge in the analog circuit by an influence of an input analog signal, a first power supply pad for supplying a digital ground source to the first electrostatic destruction protection circuit; and a second power supply pad for supplying an analog ground source to the second electrostatic destruction protection circuit, wherein a first grounding conductor connected to the first electrostatic destruction protection circuit and a second grounding conductor connected to the second electrostatic destruction protection circuit are connected to each other outside the semiconductor integrated circuit device via the first power supply pad and the second power supply pad.

2. The semiconductor integrated circuit device of claim 1, wherein the first grounding conductor and the second grounding conductor are connected to each other inside a package substrate of the semiconductor integrated circuit device.

3. The semiconductor integrated circuit device of claim 1, wherein the first grounding conductor and the second grounding conductor are connected to each other outside a package substrate of the semiconductor integrated circuit device.

4. The semiconductor integrated circuit device of claim 1, wherein the first grounding conductor and the second grounding conductor are connected to each other using a capacitance outside a package substrate of the semiconductor integrated circuit device.

5. The semiconductor integrated circuit device of claim 1, wherein the first grounding conductor and the second grounding conductor are connected to each other via a member for electrically connecting the semiconductor integrated circuit device to a package substrate of the semiconductor integrated circuit device.

* * * * *